(12) United States Patent  
Chen et al.

(10) Patent No.: US 12,479,670 B2
(45) Date of Patent: Nov. 25, 2025

(54) QUICK RELEASE ASSEMBLY FOR A PRESSING HEAD AND ELECTRONIC DEVICE TESTING APPARATUS HAVING THE SAME

(71) Applicant: CHROMA ATE INC., Taoyuan (TW)

(72) Inventors: Chien-Ming Chen, Taoyuan (TW); Ming-Yuan Huang, Taoyuan (TW)

(73) Assignee: CHROMA ATE INC., Taoyuan (TW)

( * ) Notice: Subject to any disclaimer, the term of this patent is extended or adjusted under 35 U.S.C. 154(b) by 822 days.

(21) Appl. No.: 17/849,771

(22) Filed: Jun. 27, 2022

(65) Prior Publication Data

US 2023/0086325 A1    Mar. 23, 2023

Related U.S. Application Data

(60) Provisional application No. 63/245,231, filed on Sep. 17, 2021.

(51) Int. Cl.
| | |
|---|---|
| *G01R 1/04* | (2006.01) |
| *B65G 47/90* | (2006.01) |
| *G01N 3/04* | (2006.01) |
| *G01R 31/28* | (2006.01) |
| *H01L 21/67* | (2006.01) |
| *H01L 21/673* | (2006.01) |
| *H01L 21/683* | (2006.01) |
| *H05K 13/04* | (2006.01) |

(52) U.S. Cl.
CPC ............. *B65G 47/905* (2013.01); *G01N 3/04* (2013.01); *G01R 1/0466* (2013.01); *G01R 31/2867* (2013.01); *G01R 31/2874* (2013.01); *G01R 31/2887* (2013.01); *G01R 31/2893* (2013.01); *H01L 21/67236* (2013.01); *H01L 21/67333* (2013.01); *H01L 21/6838* (2013.01); *H05K 13/0408* (2013.01)

(58) Field of Classification Search
CPC .............. G01R 1/0466; G01R 31/2887; G01R 31/2889; H01L 21/6838; B65G 47/905; H05K 13/0409
See application file for complete search history.

(56) References Cited

U.S. PATENT DOCUMENTS

| | | | |
|---|---|---|---|
| 6,407,541 B1 * | 6/2002 | Hannan | G01R 31/2851 324/762.01 |
| 8,350,584 B2 * | 1/2013 | Nappen | G01R 31/2887 324/756.07 |

(Continued)

*Primary Examiner* — Bradley Duckworth
(74) *Attorney, Agent, or Firm* — McClure, Qualey & Rodack, LLP

(57) ABSTRACT

The present invention relates to a quick release assembly for a pressing head and an electronic device testing apparatus having the same. The quick release assembly comprises an upper base, an actuator and a lower base. When the lower base is to be mounted on the upper base, the actuator drives a movable head to a first position; the movable head passes through an open slot of the lower base; then, the actuator drives the movable head to a second position so that the lower base is retained by the movable head. The open slot of the lower base is firstly fitted on the movable head of the actuator located on the upper base. At this time, the actuator is controlled to drive the movable head to the second position from the first position.

10 Claims, 4 Drawing Sheets

(56) References Cited

U.S. PATENT DOCUMENTS

| | | | | |
|---|---|---|---|---|
| 8,760,182 | B2* | 6/2014 | Wood | G01R 31/2887 |
| | | | | 324/750.16 |
| 9,494,642 | B2* | 11/2016 | Barabi | G01R 1/0466 |
| 10,254,308 | B2* | 4/2019 | Chen | H01R 13/6275 |
| 10,613,137 | B2* | 4/2020 | Mardi | G01R 31/2886 |
| 10,879,097 | B2* | 12/2020 | Wu | G01R 31/2891 |
| 11,630,147 | B2* | 4/2023 | Huang | G01R 31/2863 |
| | | | | 324/750.01 |
| 11,908,753 | B2* | 2/2024 | Yang | G01R 31/2863 |
| 2013/0181733 | A1* | 7/2013 | Kikuchi | G01R 31/2874 |
| | | | | 324/750.16 |
| 2021/0199690 | A1* | 7/2021 | Ouyang | G01R 1/0466 |
| 2024/0149468 | A1* | 5/2024 | Tanaka | H01L 21/6838 |

* cited by examiner

QUICK RELEASE ASSEMBLY FOR A PRESSING HEAD AND ELECTRONIC DEVICE TESTING APPARATUS HAVING THE SAME

BACKGROUND OF THE INVENTION

Field of the Invention

The present invention relates to a quick release assembly for a pressing head and an electronic device testing apparatus having the quick release assembly, in particular to a modularized pressing head which can be attached and detached quickly and an electronic device testing apparatus having the modularized pressing head.

Description of the Related Art

Due to the high cost of electronic device testing machines, either an equipment manufacturer or a packaging and testing plant tries to reuse a testing machine as much as possible. Modification to the machine allows the machine to be capable of testing devices under test of different specifications.

Typically, a modification method is to replace a test socket module and a pressing module in the same machine structure because these two modules are in direct contact with a device under test. Therefore, in the case of different devices under test, the test socket module for accommodating a device under test and for being in electrical contact with it and the pressing module for pressing the device under test to ensure complete electrical contact between the device under test and the test socket must be replaced.

However, in terms of the prior art, in the pressing head, there are many circuits and fluid pipe lines, such as a temperature sensing circuit, a pressure sensing circuit, a negative pressure pipe line for sucking chips, a temperature control pipe line for heating or cooling and so on, and there are also shock-absorbing dampers, error absorbers for position or angle adjustment, and so on. The related prior art is described in Taiwanese Patent No. 1733318, entitled "Pressing Mechanism, Testing Apparatus and Testing Method". Therefore, conventional pressing heads are almost all fixed on the machines by means of bolts and cannot be detached arbitrarily so that it is inconvenient for repair, maintenance and modification.

Accordingly, a quick release assembly for a pressing head which can be modularized, detached and attached quickly and which has a stable structure and excellent reliability, and an electronic device testing apparatus having the same are highly expected in the industry and the public.

SUMMARY OF THE INVENTION

The main object of the present invention is to provide a quick release assembly for a pressing head and an electronic device testing apparatus having the same so as to realize that the pressing head with a relatively stable structure and excellent reliability is modularized, can be detached and attached quickly.

To achieve the above object, a quick release assembly for a pressing head according to the present invention mainly comprises an upper base, an actuator and a lower base, wherein the upper base is provided with a through hole; the actuator includes a movable head, the actuator is disposed on an upper surface of the upper base, and the movable head passes through the through hole and protrudes from a lower surface of the upper base; the lower base includes an open slot. When the lower base is to be mounted on the upper base, the actuator drives the movable head to a first position; the movable head passes through the open slot of the lower base; then, the actuator drives the movable head to a second position so that the lower base is retained by the movable head.

In other words, the structure of the quick release assembly for the pressing head according to the present invention is simple and reliable. The open slot of the lower base is firstly fitted on the movable head of the actuator positioned on the upper base. At this time, the actuator is controlled to drive the movable head from the first position to the second position. During this driving process, the movable head is abutted against lateral edges of the open slot of the lower base so that the upper base and the lower base are tightly connected. Accordingly, the quick release assembly for the pressing head according to the present invention is not only easy to operate, but also safe and reliable. More importantly, the upper base and the lower base can be firmly coupled to or decoupled from each other simply and quickly by operating the actuator.

To achieve the above object, an electronic device testing apparatus according to the present invention comprises a plurality of quick release assemblies for a pressing head as described above, an upper fixing plate, a lower fixing plate and a lifting arm, wherein the plurality of quick release assemblies are mounted on a lower surface of the lower fixing plate, the lifting arm is mounted on an upper surface of the upper fixing plate, and the upper fixing plate is coupled to the lower fixing plate. Moreover, a damper can be arranged between each of the plurality of quick release assemblies and the lower surface of the lower fixing plate to provide a cushioning effect and avoid direct impact.

In addition, at least one draw latch can be arranged between the upper fixing plate and the lower fixing plate and includes a claw and a loop, wherein the claw can be arranged on a lateral end surface of the upper fixing plate, and the loop can be arranged on a lateral end surface of the lower fixing plate. When the upper fixing plate is coupled to the lower fixing plate, the loop is engaged with the claw. In the present invention, not only the individual pressing head can be detached and attached quickly, but also the fixing plate on which the pressing heads are mounted can also be attached or detached by using the draw latch.

DESCRIPTION OF THE PREFERRED EMBODIMENTS

Figure 1:
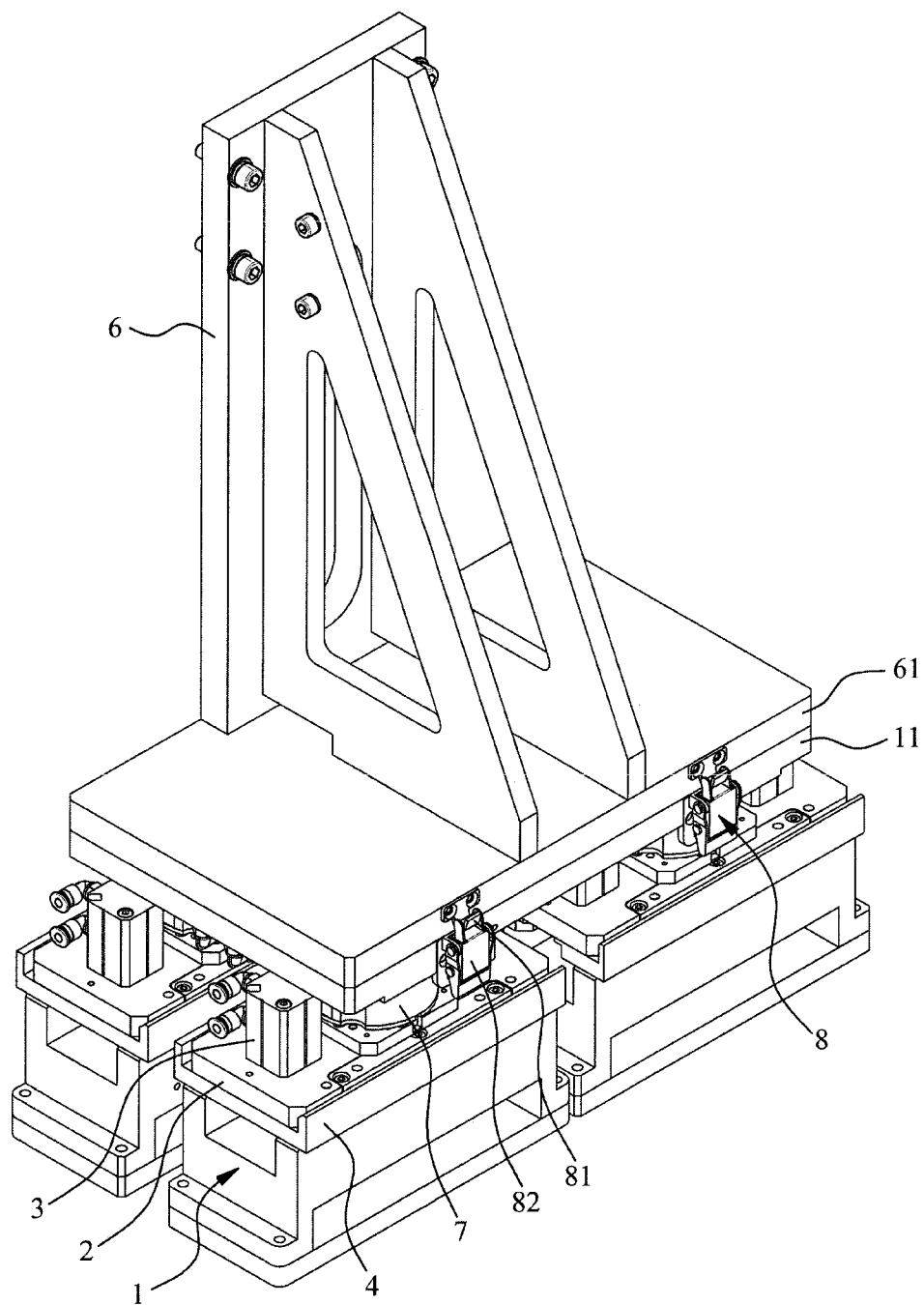
FIG. 1 is a perspective view showing an entire pressing head in a preferred embodiment of an electronic device testing apparatus of the present invention.

Before a quick release assembly for a pressing head and an electronic device testing apparatus having the same of the present invention are described in detail in the embodiments, it should be noted that in the following description, similar components will be designated by the same reference numerals. Furthermore, the drawings of the present invention are for illustrative purposes only and are not necessarily drawn to scale, and not all details are necessarily shown in the drawings.

Figure 2:
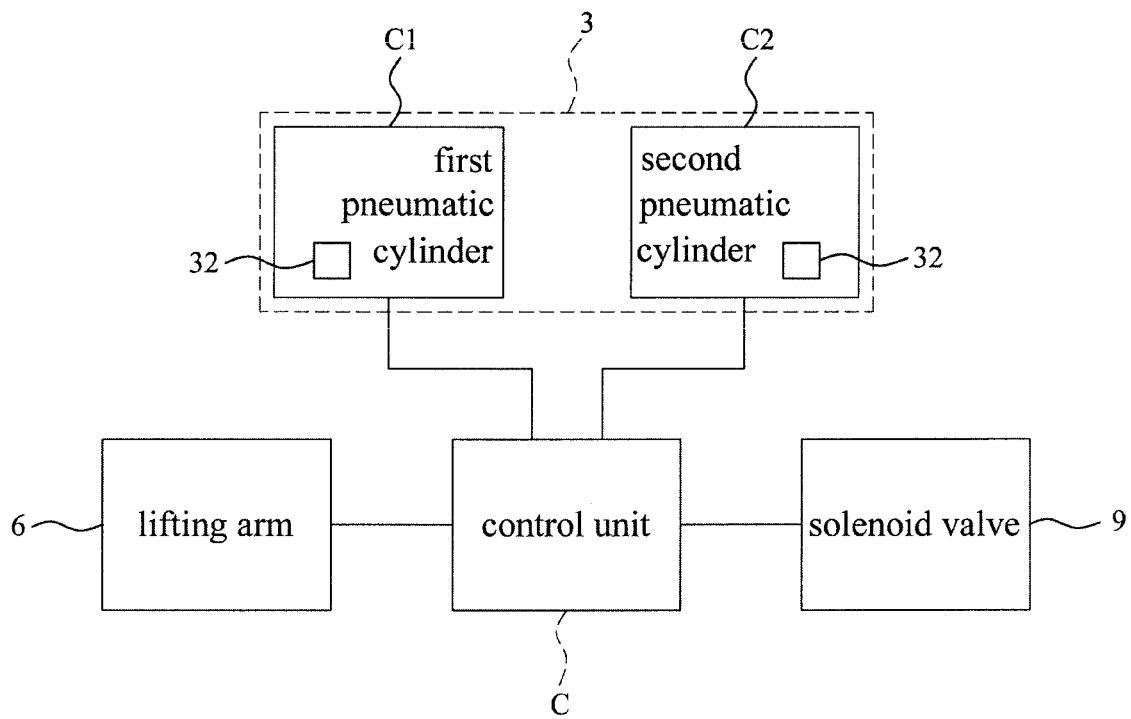
FIG. 2 is a system architecture diagram of a preferred embodiment of the electronic device testing apparatus of the present invention.

Reference is made to FIG. 1 and FIG. 2. FIG. 1 is a perspective view of an entire pressing head in a preferred embodiment of an electronic device testing apparatus of the present invention, and FIG. 2 is a system architecture diagram of a preferred embodiment of the electronic device testing apparatus of the present invention. As shown in the figures, the electronic device testing apparatus of this embodiment mainly includes four quick release assemblies 1, an upper fixing plate 61, a lower fixing plate 11, a lifting arm 6, four dampers 7 and four draw latches 8. The lift arm 6 is controlled and raised or lowered by a control unit C. The lift arm 6 can be a motor with a worm screw (not shown), a linear motor with a slide rail, a pneumatic cylinder, a hydraulic cylinder or other equivalent devices.

The lower part of the lifting arm 6 is connected to the upper fixing plate 61, and the upper fixing plate 61 is locked to the lower fixing plate 11 by means of the draw latches 8. Each draw latch 8 includes a claw 81 which is arranged on a lateral end surface of the upper fixing plate 61 and a loop 82 which is arranged on a lateral end surface of the lower fixing plate 11. When the upper fixing plate 61 is coupled to the lower fixing plate 11, the loop 82 is engaged with the claw 81. In the case that the lower fixing plate 11 is to be separated from the upper fixing plate 61, the draw latch 8 is released by simply pulling the loop 82 so that the loop 82 is disengaged from the claw 81. It is extremely fast and convenient.

The four quick release assemblies 1 are mounted on the lower surface of the lower fixing plate 11, and one damper 7 is arranged between each quick release assembly 1 and the lower fixing plate 11. The damper 7 mainly serves to provide a cushioning effect and prevent the pressing head from directly impacting on a test socket thereunder (not shown) when the lifting arm 6 is lowered for picking, placing or pressing a device under test.

Figure 3:
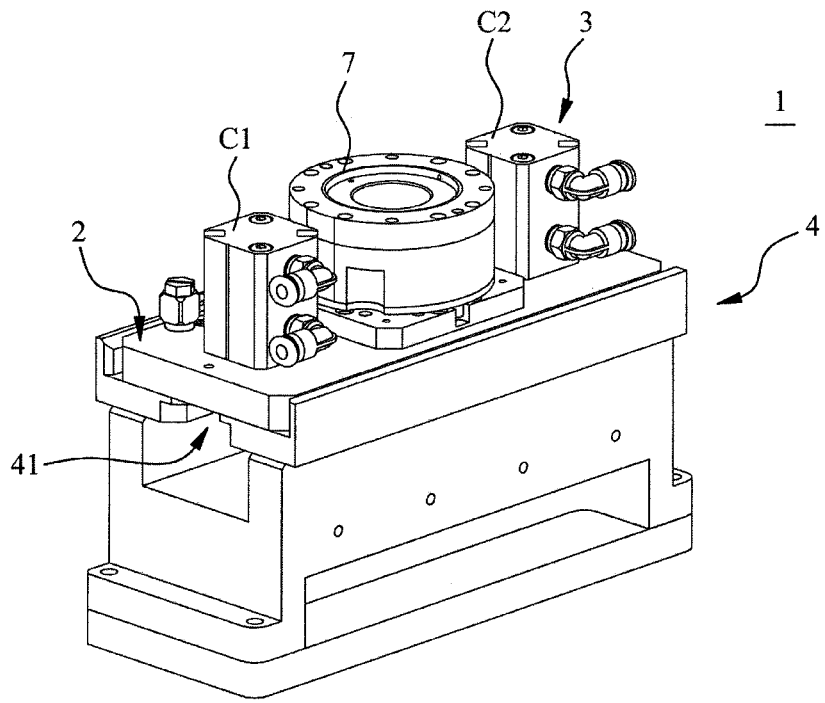
FIG. 3 is a perspective view of a preferred embodiment of a quick release assembly for the pressing head of the present invention.
Figure 4:
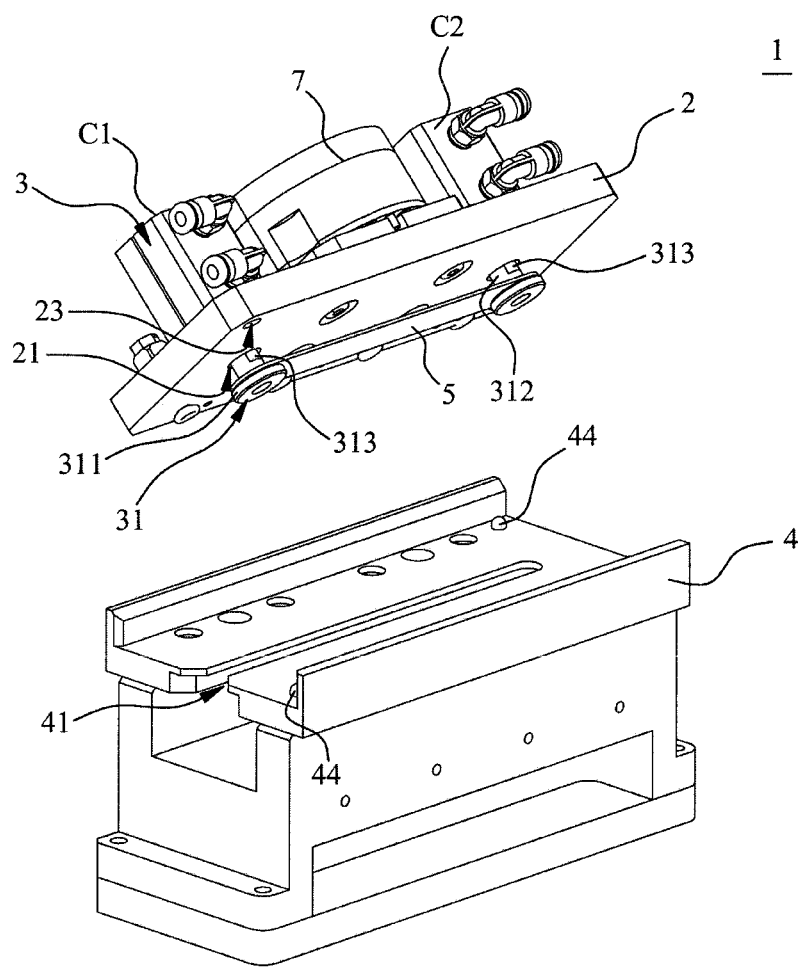
FIG. 4 is a perspective view of a preferred embodiment of the quick release assembly for the pressing head of the present invention with an upper base and a lower base being separated.

Reference is made to FIG. 1 to FIG. 4. FIG. 3 is a perspective view of a preferred embodiment of the quick release assembly for the pressing head of the present invention, and FIG. 4 is a perspective view of a preferred embodiment of the quick release assembly for the pressing head of the present invention with an upper base and a lower base being separated from each other. The quick release assembly 1 of this embodiment will be further described below. In this embodiment, each quick release assembly 1 mainly includes an upper base 2, two actuators 3 and a lower base 4.

The upper base 2 is formed with two through holes 21. The two actuators 3 are a first pneumatic cylinder C1 and a second pneumatic cylinder C2 respectively. The first pneumatic cylinder C1 and the second pneumatic cylinder C2 are arranged on the upper surface of the upper base 2, and each of the pneumatic cylinders C1 and C2 includes a movable head 31. The movable head 31 includes a flange 311 and a neck 312. The neck 312 of the movable head 31 is extended through the through hole 21 of the upper base 2, and a portion of the neck 312 and the flange 311 are protruded from the lower surface of the upper base 2.

The upper surface of the lower base 4 includes an open slot 41, which is an elongated slot opened at a lateral end of the lower base 4. Two opposite sides of the neck 312 of the movable head 31 each include a flat portion 313 which is a specific portion formed by cutting the circumference of the neck 312 in the axial direction, and the distance between the flat portions 313 is equal to the width of the elongated slot. The flat portions 313 are so configured that the distance between the flat portions 313 matches the width of the open slot 41 and that they provide a guiding effect when the neck 312 is being fitted into the open slot 41. Even if only one movable head 31 is fitted into the open slot 41, the lower base 4 would not be swung.

FIG. 4 shows an elongated retaining plate 5, which includes two through holes 51 (shown in FIG. 5A), and the two through holes 51 are respectively fitted on the necks 312 of the movable heads 31 of the first pneumatic cylinder C1 and the second pneumatic cylinder C2 and are restrained by the flanges 311. Preferably, the elongated retaining plate 5 is directly attached to the upper surface of the flanges 311. Accordingly, in this embodiment, the elongated retaining plate 5 is connected with the movable heads 31 of the first pneumatic cylinder C1 and the second pneumatic cylinder C2 so that when the open slot 41 of the lower base 4 is fitted on the necks 312, the movable heads 31 at both ends can smoothly slide into the open slot 41 in sequence under guidance of the elongated retaining plate 5. The situation that only one movable head 31 at one end slides into the open slot 41 while the other movable head 31 at the other end is out of the open slot 41 can be completely avoided.

Figure 5A:
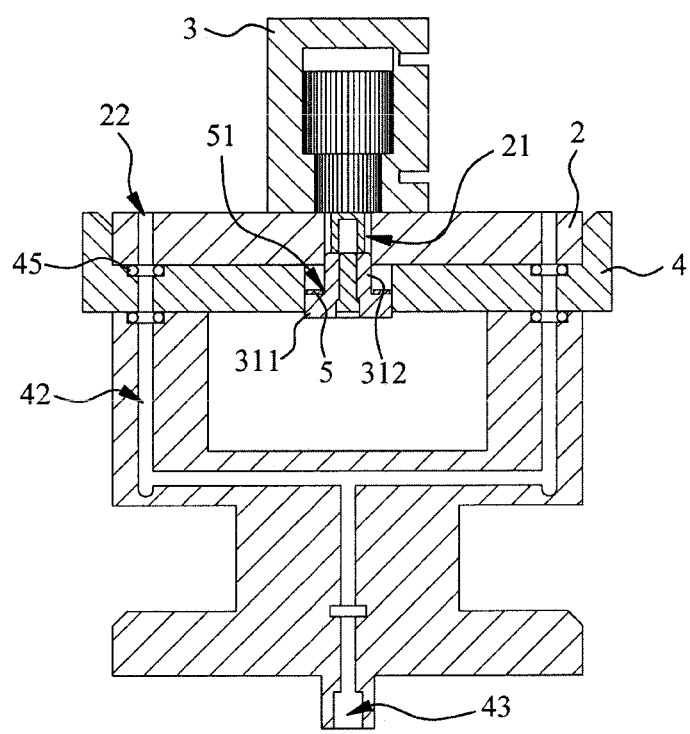
FIG. 5A is a cross-sectional view showing that a movable head of an actuator is located in a first position in a preferred embodiment of the quick release assembly for the pressing head of the present invention.
Figure 5B:
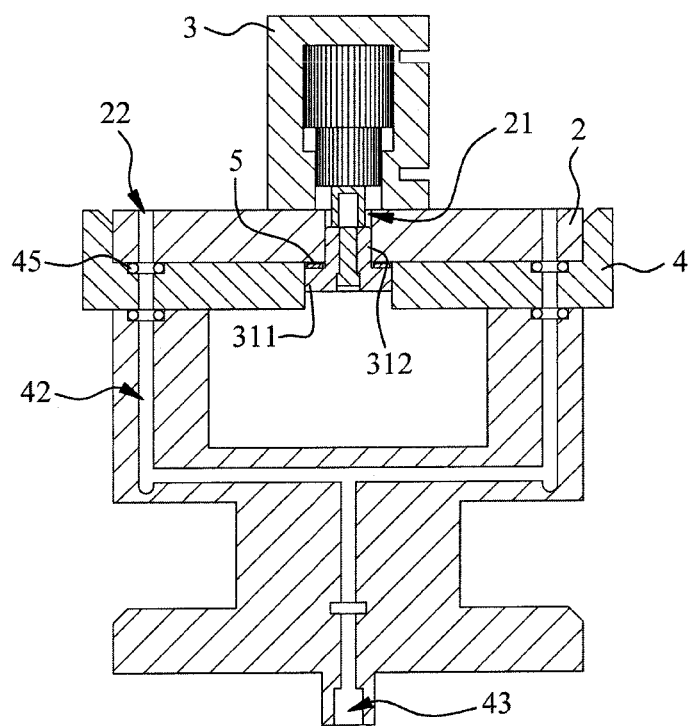
FIG. 5B is a cross-sectional view showing that the movable head of the actuator is located in a second position in a preferred embodiment of the quick release assembly for the pressing head of the present invention.

Reference is made to FIG. 4, FIG. 5A and FIG. 5B. FIG. 5A is a cross-sectional view showing that the movable head of the actuator is located in a first position in a preferred embodiment of the quick release assembly for the pressing head of the present invention, and FIG. 5B is a cross-sectional view showing that the movable head of the actuator is located in a second position in a preferred embodiment of the quick release assembly for the pressing head of the present invention.

The operation of the quick release assembly 1 of this embodiment will be described below. First, when the lower base 4 is to be mounted on the upper base 2, the control unit C controls the actuators 3 to drive the movable heads 31 to the first position which is a limit position to which the movable heads 31 can be extended, as shown in FIG. 5A.

The open end of the open slot 41 of the lower base 4 is aligned with the movable heads 31 of the actuators 3. Then, the lower base 4 is slid along the upper base 21 and is located directly under the upper base 21 so that the necks 312 of the movable heads 31 of the actuators 3 are fitted into the open slot 41, and the flanges 311 and the elongated retaining plate 5 are located under the open slot 41. Moreover, in this embodiment, two positioning pins 44 are diagonally and symmetrically provided on the upper surface of the lower base 4, and two positioning holes 23 are diagonally and symmetrically provided on the lower surface of the upper base 2. Once the open slot 41 of the lower base 4 is completely fitted on the necks 312 of the movable heads 3 of the actuators 3, the two positioning pins 44 of the lower base 4 are aligned with the two positioning holes 23 of the upper base 2.

Next, the control unit C controls the actuators 3 to drive the movable heads 31 axially to the second position which is a limit position to which the movable heads 31 is retracted, as shown in FIG. 5B. At this time, the flanges 311 of the movable heads 31 tightly clamp the two lateral edges of the open slot 41 of the lower base 4 and the elongated retaining plate 5 so that the upper base 2 and the lower base 4 are tightly connected. Accordingly, mounting of the lower base 4 is accomplished.

On the other hand, when the lower base 4 is to be detached from the upper base 2, the control unit C controls the actuators 3 to drive the movable heads 31 to the first position, as shown in FIG. 5A. At this time, the lower base 4 can be detached from the upper base 2 by simply sliding the lower base 4 along the open slot 41 in an opposite direction so that the movable heads 31 is disengaged from the open slot 41.

It is noted that each of the first pneumatic cylinder C1 and the second pneumatic cylinder C2 in this embodiment is provided with a position sensor 32 (shown in FIG. 2), which serves to determine whether the movable head 31 is located at the first position or the second position as expected. For example, the position sensor 32 can be a proximity switch, an optoelectronic switch or a pressure sensor. Once the current position of the movable head 31 is not the first position or the second position, the control unit C determines that the lower base 4 is not successfully attached or detached and then issues a warning to notify the operator who is on duty.

Reference is made to FIG. 2, FIG. 5A, and FIG. 5B again. The quick release assembly 1 for the pressing head of this embodiment also provides a negative pressure gas channel so as to provide a chip sucking function and a chip pick-and-place function. Specifically, the upper base 2 includes a negative pressure channel 22, one end of which is coupled to a negative pressure source (not shown) and the other end of which is located on the lower surface of the upper base 2. Moreover, the lower base 4 includes a fluid channel 42, one end of which is located on the upper surface of the lower base 4, and the other end of which is located on the lower surface of the lower based 4 and constitutes a chip pick-and-place port 43.

Accordingly, when the lower based 4 is mounted on the upper base 2, the negative pressure channel 22 of the upper based 2 is aligned with the fluid channel 42 of the lower based 4 so that the chip pick-and-place port 43 is communicated with the negative pressure source to form a negative pressure for sucking a device under test, in addition, an O-ring 45 is also provided at the junction of the two channels for avoiding air leakage. As shown in FIG. 2, in this embodiment, a solenoid valve 9 which is electrically connected to the control unit C is provided between the negative pressure channel 22 of the upper base 2 and the negative pressure source for enabling or disabling communication of the negative pressure channel 22 with the negative pressure source, i.e. for controlling suction or placement of a device under test (not shown).

Generally speaking, this embodiment at least has the following unexpected effects:

1. Attachment and detachment are quite simple. The control unit issues a control command to activate the pneumatic cylinders, and then, the operator to guide the lower base along the open slot so that the open slot is fitted on the movable heads or that the movable heads are disengaged from the open slot. Moreover, the upper base and the lower base are modularized and can be tightly connected to each other by the pneumatic cylinders so that the pressing head is detached and attached quickly with excellent reliability.

2. The distance between the flat portions of the neck of the movable head exactly matches the width of the open slot so that a guiding effect is provided. Even if only one movable head is fitted into the opening slot, the lower base would not be swung from side to side.

3. The elongated retaining plate is connected to the movable heads of the first pneumatic cylinder and the second pneumatic cylinder so that when the open slot of the lower base is fitted on the necks, the movable heads at both ends can smoothly slide into the open slot in sequence under guidance of the elongated retaining plate. The situation that only one movable head at one end slides into the open slot, and the other movable head 31 at the other end is out of the open slot.

4. Each of the first pneumatic cylinder and the second pneumatic cylinder is provided with a position sensor. Once the current position of the movable head is not the first position or the second position, the control unit determines that the lower base is not successfully attached or detached and then issues a warning to notify the operator who is on duty.

5. Two positioning holes are diagonally and symmetrically provided on the lower surface of the upper base, and two positioning pin are diagonally and symmetrically provided on the upper surface of the lower base. When the lower base is to be mounted on the upper base, the positioning pins can be aligned with the positioning holes so that the upper base and the lower base can be precisely aligned.

6. The upper base is provided with a negative pressure channel, and the lower base is provided with a fluid channel. When the lower based is mounted on the upper base, the negative pressure channel of the upper based is aligned with the fluid channel of the lower based so that the chip pick-and-place port can be connected to the negative pressure source to form a negative pressure and adsorb a device under test. In addition, an O-ring is also provided at the junction of the two channels in order to avoid air leakage.

7. The lower fixing plate and the upper fixing plate can be quickly connected to or disconnected from each other by means of the draw latch. When the upper fixing plate is to be coupled to the lower fixing plate, the draw latch is operated in such a manner that the loop is engaged with the claw, and when the lower fixing plate is to be separated from the upper fixing plate, the draw latch is operated in such a manner that the loop is disengaged from the claw.

The preferred embodiments of the present invention are illustrative only, and the claimed inventions are not limited to the details disclosed in the drawings and the specification. Accordingly, it is intended that it have the full scope permitted by the language of the following claims.

What is claimed is:

1. A quick release assembly for a pressing head, comprising:
    an upper base provided with at least one through hole;
    at least one actuator including a movable head, the at least one actuator being disposed on an upper surface of the upper base, the movable head passing through the at least one through hole and protruding from a lower surface of the upper base; and
    a lower base including an open slot,
    wherein when the lower base is to be mounted on the upper base, the at least one actuator drives the movable head to a first position; the movable head passes through the open slot of the lower base; then, the at least one actuator drives the movable head to a second position so that the lower base is retained by the movable head.

2. The quick release assembly of claim 1, wherein the movable head includes a flange and a neck; when the lower base is to be mounted on the upper base, after the neck of the movable head passes through the open slot of the lower base, the at least one actuator axially drives the movable head to the second position so that the lower base is retained by the flange of the movable head.

3. The quick release assembly of claim 2, wherein the open slot is an elongated slot, two opposite sides of the neck of the movable head each include a flat portion, and a distance between the flat portions is equal to a width of the elongated slot.

4. The quick release assembly of claim 2, further comprising an elongated retaining plate, which includes two through holes, wherein the at least one actuator includes a first pneumatic cylinder and a second pneumatic cylinder, and the two through holes of the elongated retaining plate are respectively fitted on the necks of the movable heads of the first pneumatic cylinder and the second pneumatic cylinder and restrained by the flanges.

5. The quick release assembly of claim 4, wherein the first pneumatic cylinder and the second pneumatic cylinder each include a position sensor for sensing a position of the movable head.

6. The quick release assembly of claim 1, wherein the upper base includes at least one negative pressure channel, and the lower base includes at least one fluid channel and at least one chip pick-and-place port; when the lower base is mounted on the upper base, one end of the at least one fluid channel is communicated with the at least one negative pressure channel, and the other end of the at least one fluid channel is communicated with the at least one chip pick-and-place port.

7. The quick release assembly of claim 1, wherein the lower surface of the upper base includes at least one positioning hole, and the upper surface of the lower base includes at least one positioning pin; when the lower base is to be mounted on the upper base, the at least one positioning pin is aligned with the at least one positioning hole, and then the at least one actuator drives the movable head to the second position so that the lower base is retained by the movable head.

8. An electronic device testing apparatus, comprising:
a plurality of quick release assemblies of claim 1;
an upper fixing plate;
a lower fixing plate; and
a lifting arm,
wherein the plurality of quick release assemblies are mounted on a lower surface of the lower fixing plate, the lifting arm is mounted on an upper surface of the upper fixing plate, and the upper fixing plate is coupled to the lower fixing plate.

9. The electronic device testing apparatus of claim 8, further comprising a plurality of dampers, respectively arranged between the plurality of quick release assemblies and the lower surface of the lower fixing plate.

10. The electronic device testing apparatus of claim 8, further comprising at least one draw latch, wherein the at least one draw latch includes a claw and a loop, the claw is arranged on a lateral end surface of the upper fixing plate, and the loop is arranged on a lateral end surface of the lower fixing plate; when the upper fixing plate is coupled to the lower fixing plate, the loop is engaged with the claw.

* * * * *